United States Patent
Maeda et al.

(10) Patent No.: US 11,193,200 B2
(45) Date of Patent: Dec. 7, 2021

(54) PVD PROCESSING METHOD AND PVD PROCESSING APPARATUS

(71) Applicant: Tokyo Electron Limited, Tokyo (JP)

(72) Inventors: Koji Maeda, Yamanashi (JP); Hiroyuki Yokohara, Yamanashi (JP); Hiroshi Sone, Yamanashi (JP); Tetsuya Miyashita, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 80 days.

(21) Appl. No.: 16/202,238

(22) Filed: Nov. 28, 2018

(65) Prior Publication Data

US 2019/0169737 A1    Jun. 6, 2019

(30) Foreign Application Priority Data

Dec. 5, 2017  (JP) .............................. JP2017-233708

(51) Int. Cl.
| | | |
|---|---|---|
| *C23C 14/04* | (2006.01) | |
| *C23C 14/08* | (2006.01) | |
| *C23C 14/34* | (2006.01) | |
| *C23C 14/18* | (2006.01) | |

(52) U.S. Cl.
CPC ........ *C23C 14/3464* (2013.01); *C23C 14/042* (2013.01); *C23C 14/081* (2013.01); *C23C 14/185* (2013.01); *C23C 14/3414* (2013.01)

(58) Field of Classification Search
None
See application file for complete search history.

(56) References Cited

U.S. PATENT DOCUMENTS

2017/0178877 A1    6/2017  Wang et al.
2018/0291500 A1*  10/2018  Wang ................... C23C 14/081

FOREIGN PATENT DOCUMENTS

| JP | H03-183778 A | 8/1991 |
|---|---|---|
| JP | 09-165679 A | 6/1997 |
| JP | 2017-112439 A | 6/2017 |

* cited by examiner

*Primary Examiner* — Jose I Hernandez-Kenney
(74) *Attorney, Agent, or Firm* — Abelman, Frayne & Schwab

(57) ABSTRACT

Disclosed is a PVD processing method including a first process, a second process, a third process, and a fourth process. In the first process, an opening of a shield, which is provided between a first target containing a metal oxide and a second target containing a metal constituting the metal oxide, and a stage on which a substrate as a film formation object is placed, is made to coincide with the first target so as to expose the first target to the stage and the opening is brought close to the first target. In the second process, sputtering is performed using the first target. In the third process, the opening is made to coincide with the second target so as to expose the first target to the stage, and the opening is brought close to the second target. In the fourth process, sputtering is performed using the second target.

8 Claims, 8 Drawing Sheets

PVD PROCESSING METHOD AND PVD PROCESSING APPARATUS

CROSS-REFERENCE TO RELATED APPLICATIONS

This application is based on and claims priority from Japanese Patent Application No. 2017-233708 filed on Dec. 5, 2017 with the Japan Patent Office, the disclosure of which is incorporated herein in its entirety by reference.

TECHNICAL FIELD

Various aspects and exemplary embodiments of the present disclosure relate to a PVD processing method and a PVD processing apparatus.

BACKGROUND

Magnetoresistive random access memory (MRAM) has been developed as a magnetoresistive element having a magnetic tunnel junction (MTJ) element region. The MTJ element region includes an insulating layer made of a metal oxide provided between two magnetic layers. Such an insulating layer is often formed by physical vapor deposition (PVD) such as, for example, a sputtering method using a target including a metal oxide.

In the sputtering method, by sputtering the surface of the target with, for example, argon (Ar) ions, particles generated from the target are deposited on the substrate of a substrate surface, whereby a thin film containing elements contained in the target is formed on the surface of the substrate. However, the particles generated from the target also scatter in directions other than the direction facing the substrate. Therefore, the particles generated from the target are also deposited on the surfaces of members in the chamber other than the surface of the substrate, and eventually scatter into the chamber as particles. When the main component of the target is a metal oxide, particles generated from the target and deposited on the surfaces of the members in the chamber are fragile and easily peeled off. In order to avoid this, a shield may be provided around the target to limit the scattering of particles in directions other than the direction facing the substrate. See, for example, Japanese Patent Laid-open Publication No. 09-165679.

SUMMARY

One aspect of the present disclosure is a PVD processing method including a first process, a second process, a third process, and a fourth process. In the first process, an opening of a shield, which is provided between a first target containing a metal oxide as a main component and a second target containing a metal constituting the metal oxide as a main component, and a stage on which a substrate as a film formation object is placed, is made to coincide with the first target so as to expose the first target to the stage and the opening is brought close to the first target. In the second process, sputtering is performed using the first target. In the third process, the opening of the shield is made to coincide with the second target so as to expose the first target to the stage, and the opening is brought close to the second target. In the fourth process, sputtering is performed using the second target.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
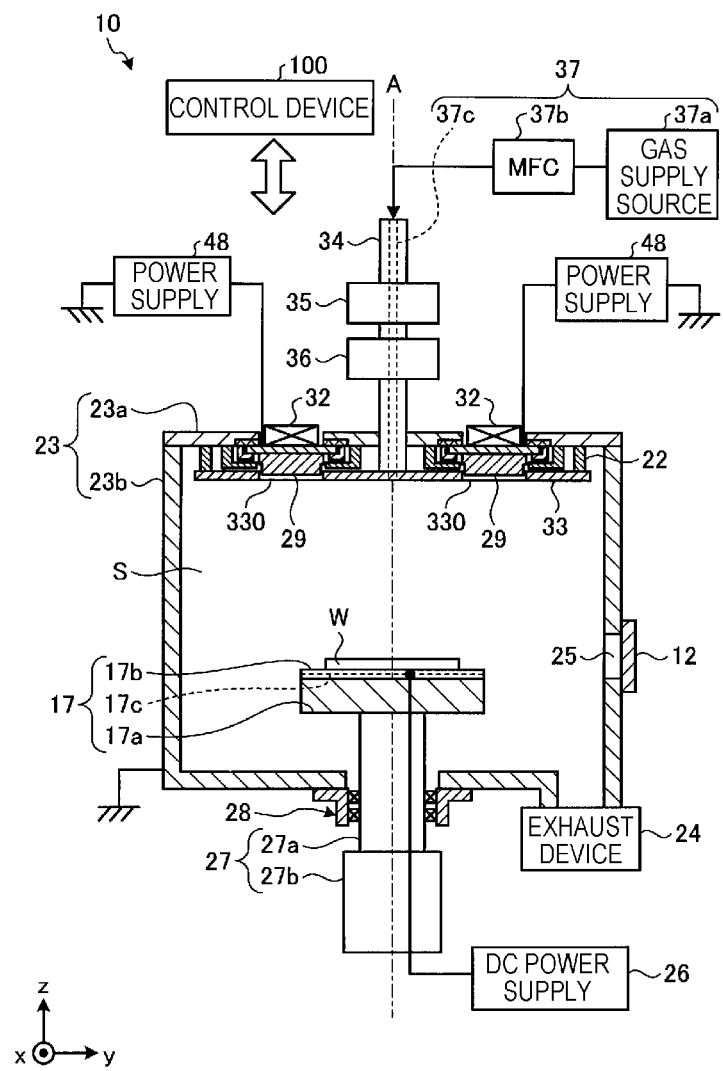
FIG. 1 is a sectional view schematically illustrating a configuration of a PVD processing apparatus.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

By providing a shield around the target, it is possible to suppress the amount of particles deposited on the surfaces of the members in the chamber. However, since the shield is disposed in the vicinity of the target, particles generated from the target are likely to be deposited on the shield. Therefore, particles deposited on the shield may be turned into particles and scatter into the chamber in some cases. In addition, as described in Patent Document 1, it is possible to suppress the generation of particles by controlling the temperature of the shield. However, when sputtering is repeated many times in order to form an insulating layer on a large number of substrates, the particles deposited on the shield are eventually turned into particles and scatter into the chamber.

One aspect of the present disclosure is a PVD processing method including a first process, a second process, a third process, and a fourth process. In the first process, an opening of a shield, which is provided between a first target containing a metal oxide as a main component and a second target containing a metal constituting the metal oxide as a main component, and a stage on which a substrate as a film formation object is placed, is made to coincide with the first target so as to expose the first target to the stage and the opening is brought close to the first target. In the second process, sputtering is performed using the first target. In the third process, the opening of the shield is made to coincide with the second target so as to expose the first target to the stage, and the opening is brought close to the second target. In the fourth process, sputtering is performed using the second target.

The above-described PVD processing method further includes: a fifth process of moving the shield to a position located away from the first target and the second target; and a sixth process of performing sputtering using the second target after the fifth process.

In the above-described PVD processing method, in the sixth process, the sputtering is performed using the second target in each of a state where the second target is exposed to the stage via the opening and a state where the second target is shielded by the shield.

The above-described PVD processing method further includes: a seventh process of performing sputtering using the first target in a state where the shield is at a position located away from the first target and the second target after the fourth process or the sixth process.

In the above-described PVD processing method, in the seventh process, the sputtering is performed using the first target in each of a state where the first target is exposed to the stage via the opening and a state where the first target is shielded by the shield.

The above-described PVD processing method further includes: an eighth process of making the opening of the shield coincide with the first target so as to expose the second target to the stage, and bringing the opening close to the first target after the sixth process or the seventh process; and a ninth process of performing sputtering using the first target.

In the above-described PVD processing method, the third to seventh processes are further performed before the first process.

In the above-described PVD processing method, the metal oxide is magnesium oxide, and the metal constituting the metal oxide is magnesium.

One aspect of the present disclosure is a PVD processing apparatus including: a first cathode having a first target containing a metal oxide as a main component; a second cathode having a second target containing a metal constituting the metal oxide as a main component; a holding unit on which the first cathode and the second cathode are disposed; a stage on which a substrate as a film formation object is placed; a shield provided between the holding unit and the stage and having an opening; a movement mechanism configured to move the shield toward and away from the first target and the second target; and a rotation mechanism configured to rotate the shield about a rotation axis so as to expose one of the first cathode and the second cathode and to shield remaining one of the first cathode and the second cathode with respect to the stage.

In the above-described PVD processing apparatus, two first cathode and two second cathode are held on the holding unit, and the first cathodes and the second cathodes are alternately arranged on the holding unit in a circumferential direction around the rotation axis.

In the above-described PVD processing apparatus, the shield has two openings, and the openings are rotated by the rotation mechanism such that either the two first targets or the two second targets are exposed to the stage and remaining targets are shielded with respect to the stage.

In the above-described PVD processing apparatus, the shield having a heater embedded therein so as to heat the shield to a predetermined temperature.

According to various aspects and embodiments of the present disclosure, it is possible to suppress generation of particles.

Hereinafter, embodiments of a PVD processing method and a PVD processing apparatus disclosed herein will be described in detail below with reference to the accompanying drawings. The PVD processing method and PVD processing apparatus disclosed herein are not limited by the following embodiments.

Configuration of PVD Processing Apparatus 10

FIG. 1 is a sectional view schematically illustrating a configuration of a PVD processing apparatus 10. As illustrated in FIG. 1, for example, the PVD processing apparatus 10 includes a chamber 23 formed in a substantially cylindrical shape with, for example, aluminum, a stage 17 disposed at a lower side of a processing space S within the chamber 23 and configured to place a wafer W thereon, and an exhaust device 24 including, for example, a cryopump or a dry pump, which maintains the processing space S within the chamber 23 in a reduced pressure environment. The chamber 23 is grounded. The wafer W is an example of a substrate as a film formation object.

The chamber 23 has a substantially cylindrical side wall 23b having an open top and a ceiling portion 23a provided above the side wall 23b so as to close the open top of the side wall 23b. The ceiling portion 23a is grounded via the side wall 23b. In the side wall 23b of the chamber 23, an opening 25 is formed so as to be used for loading a wafer W before film formation into the chamber 23 and unloading the wafer W after film formation from the chamber 23. The opening 25 is opened and closed by a gate valve 12.

The stage 17 has a substantially disc shape, and includes a base unit 17a formed of stainless steel, for example, and an electrostatic chuck 17b provided on the base unit 17a. The electrostatic chuck 17b incorporates an electrode film 17c therein, and the electrode film 17c is connected to the direct current (DC) power supply 26. When a DC voltage is applied from the DC power supply 26 to the electrode film 17c, the electrostatic chuck 17b attracts and holds the wafer W placed on the upper surface thereof.

The stage 17 is supported by a stage driving mechanism 27 below the chamber 23. The stage drive mechanism 27 has a substantially cylindrical support shaft 27a arranged in a z-axis direction in FIG. 1 and a drive device 27b connected to the lower end of the support shaft 27a. The upper end of the support shaft 27a is connected to the lower surface of the base unit 17a. The driving device 27b rotates the support shaft 27a about an axis A parallel to the z axis illustrated in FIG. 1. In the present embodiment, the wafer W is placed on the electrostatic chuck 17b such that the axis A passes through the center thereof.

Further, the driving device 27b is capable of vertically moving the stage 17 in the z-axis direction by vertically moving the support shaft 27a in the z-axis direction. The support shaft 27a passes through the bottom portion of the chamber 23. A sealing member 28 is disposed between the support shaft 27a and the bottom portion of the chamber 23, and an airtight state inside the chamber 23 is maintained.

Figure 2:
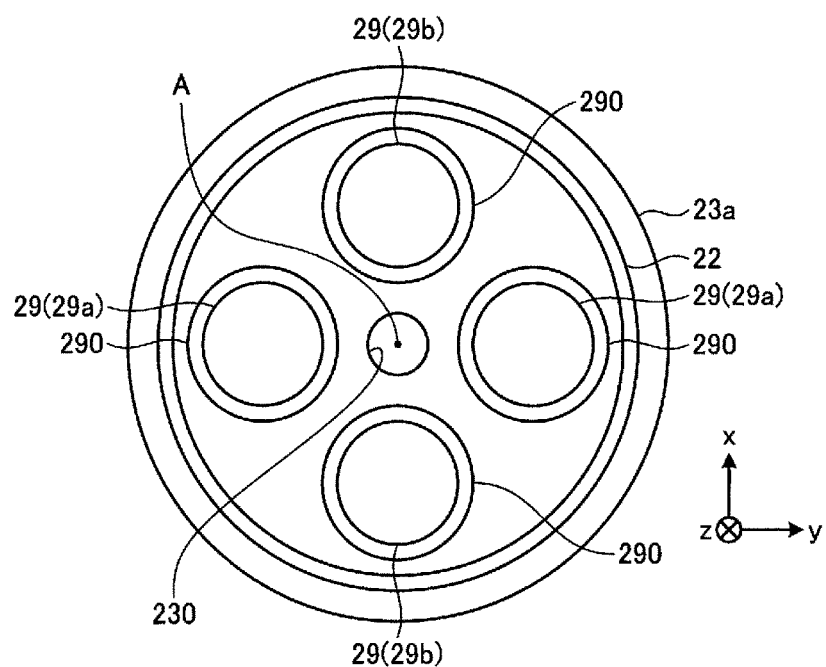
FIG. 2 is a plan view illustrating an example of an arrangement of targets when a ceiling portion is viewed from below.

On the ceiling portion 23a of the chamber 23, a plurality of targets 29 are arranged. FIG. 2 is a diagram illustrating an example of an arrangement of targets 29 when the ceiling portion 23a is viewed from below. In the present embodiment, four targets 29 are arranged on the ceiling portion 23a, for example, as shown in FIG. 2. The number of the targets 29 arranged on the ceiling portion 23a may be three or less, or five or more. In the present embodiment, the four targets 29 are arranged outside the region of the wafer W on the stage 17 in the direction of the axis A.

Further, in the present embodiment, for example, as illustrated in FIG. 2, among the four targets 29, two targets 29 are first targets 29a containing a metal oxide as a main component, the remaining two targets 29 are the second targets 29b containing a metal constituting the metal oxide as a main component. The two first targets 29a and the two second targets 29b are alternately arranged at equal intervals on the circumference of the same circle having the axis A as the center. In the present embodiment, the first targets 29a are used for film formation of a metal oxide film on the wafer W and conditioning within the chamber 23. The second targets 29b are used for pasting the metal oxide deposited on the surfaces of the members in the chamber 23 by sputtering using the first targets 29a.

Here, the metal oxide is easily separated. Therefore, the metal oxide attached to the surfaces of the members in the chamber 23 may be separated from the surfaces of the members and scattered into the chamber 23 in some cases. On the other hand, a film made of the metal constituting the metal oxide has higher toughness than the film made of the metal oxide. Therefore, even if the film made of the metal adheres to the surfaces of the members in the chamber 23, it is difficult to separate the film. Therefore, in the present embodiment, so-called pasting is performed in which the surfaces of the members in the chamber 23 to which the metal oxide has adhered are covered with the metal constituting the metal oxide. As a result, scattering of the metal oxide which has adhered to the surfaces of the members in the chamber 23 is suppressed.

In the present embodiment, the metal oxide which is the main component of the first targets 29a is magnesium oxide (MgO), and the metal which is the main component of the second targets 29b is magnesium (Mg). The metal oxide which is the main component of the first targets 29a and the metal which is the main component of the second targets 29b may be, for example, tantalum oxide ($TaO_2$, $Ta_2O_5$) and tantalum (Ta). In the following description, the first targets 29a and the second targets 29b may be simply referred to as "targets 29" when they are collectively referred to without distinguishing them.

Further, as illustrated in FIG. 2, for example, the periphery of each of the first targets 29a and the second targets 29b is surrounded by a cover member 290 formed of a conductor. An opening 230 through which a support shaft for rotating a shield (to be described later) around the axis A or moving along the axis A passes is formed substantially at the center of the ceiling portion 23a. A ground member 22 such as a spiral contact formed of a conductor is provided outside the region where the plurality of targets 29 are arranged in the region of the lower surface of the ceiling portion 23a.

Figure 3:
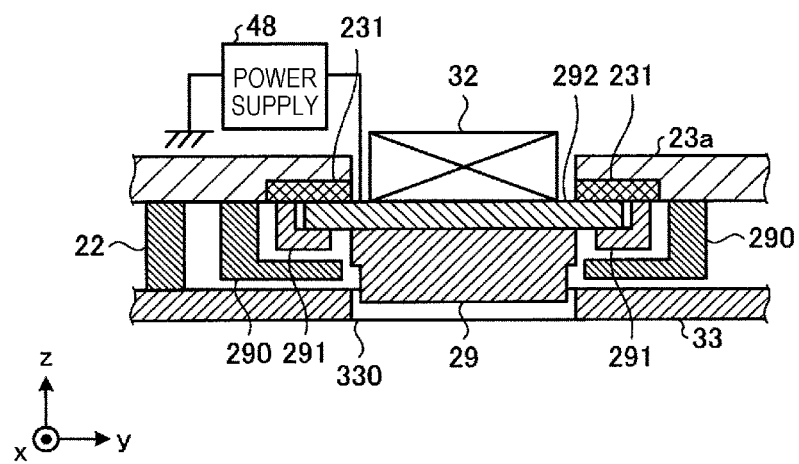
FIG. 3 is an enlarged sectional view illustrating an example of a structure around a target.

FIG. 3 is an enlarged sectional view illustrating an example of a structure around a target 29. For example, as illustrated in FIG. 3, each target 29 is fixed to a base plate 292, and the base plate 292 is fixed to the ceiling portion 23a via the insulating member 231 by a clamp 291. A cover member 290 made of a conductor is provided so as to cover the clamp 291 around the target 29, and the cover member 290 is grounded via the ceiling portion 23a. Further, in the base plate 292, a magnet 32 is provided on the surface opposite to the surface on which the target 29 is provided. The ground member 22 is grounded via the ceiling portion 23a. The ground member 22 comes into contact the shield 33 so as to ground the shield 33 when the shield 33 is in a position close to the target 29. The ceiling portion 23a is an example of a holding portion that holds the plurality of targets 29.

A power supply 48 is connected to each target 29. A power supply 48a is connected to the first target 29a containing a metal oxide as a main component so as to apply an alternating current (AC) voltage to the first target 29a. A power supply 48b is connected to the second target 29b containing a metal contained in the metal oxide as a main component so as to apply a negative DC voltage.

When sputtering is performed using the first target 29a, an AC voltage is applied to the first target 29a from the power supply 48a. When sputtering is performed using the second target 29b, a negative DC voltage is applied to the second target 29b from the power source 48b. As a result, each target 29 behaves as a cathode electrode. A first target 29a and a base plate 292 provided with the first target 29a are an example of a first cathode. A second target 29b and a base plate 292 provided with the second target 29b are an example of a second cathode. In the example of FIG. 1, one power supply 48 is provided for one target 29, but one power supply 48 may be provided in common for a plurality of targets 29. Specifically, one power source 48a to apply an AC voltage to a plurality of first targets 29a may be provided in common, or one power 48b to apply a DC voltage to a plurality of second targets 29b may be provided in common.

Figure 4:
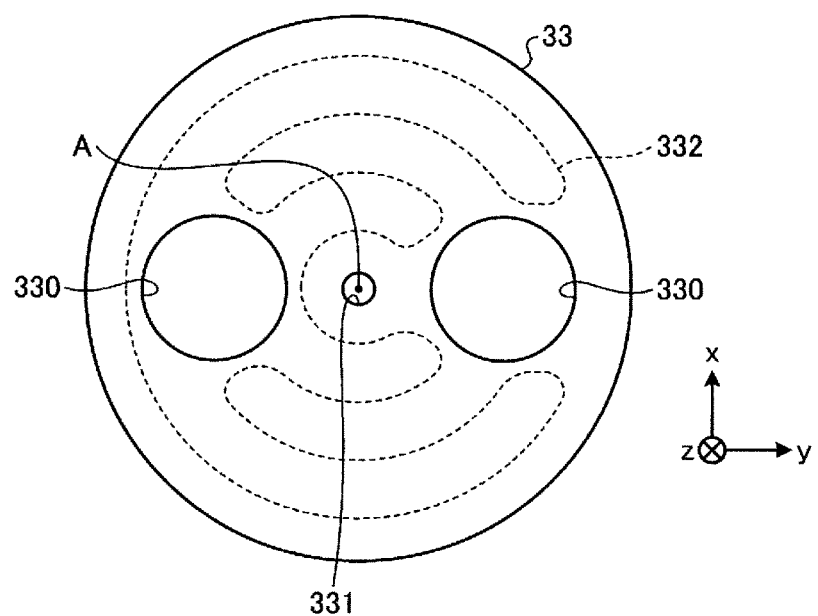
FIG. 4 is a plan view illustrating an example of a shield.

Inside the chamber 23, a shield 33 is arranged between each target 29 and the stage 17. FIG. 4 is a plan view illustrating an example of the shield 33. The shield 33 in the present embodiment is formed in a substantially disc shape with aluminum, for example, and is arranged in the chamber 23 such that the axis A passes through the center of the shield 33. In addition, a plurality of openings 330 are formed in the shield 33. The size of the region of each opening 330 is slightly larger than that of the region of the lower surface of the target 29.

In addition, a gas supply port 331 configured to supply a processing gas such as, for example, Ar gas to the processing space S within the chamber 23 is formed substantially at the center of the shield 33. A heater 332 is embedded in the shield 33, and a power supply (not illustrated) is connected to the heater 332. In the present embodiment, by adjusting the power supplied to the heater 332, the shield 33 is heated to a substantially constant temperature (e.g., 180 to 200° C.). As a result, the expansion and contraction of the shield 33 due to a temperature change is capable of suppressing the fluctuation of stress generated in the deposit deposited on the shield 33, thereby suppressing the separation of the deposit from the shield 33.

Referring back to FIG. 1, the description will be continued. A support shaft 34 is connected to substantially the center of the shield 33. The support shaft 34 is moved in the vertical direction along the axis A by a movement mechanism 35. As the support shaft 34 moves in the vertical direction by the movement mechanism 35, the shield 33 moves in the vertical direction inside the chamber 23. As a result, the shield 33 moves in a direction toward or away from the targets 29. When the shield 33 moves to a position close to the targets 29, for example, as illustrated in FIG. 3, the upper surface of the shield 33 comes into contact with the ground member 22. As a result, the shield 33 is grounded via the ground member 22.

The support shaft 34 is rotated about the axis A by a rotation mechanism 36. As the support shaft 34 rotates by the rotation mechanism 36, the shield 33 rotates around the axis A in the chamber 23. As the shield 33 rotates, the openings 330 of the shield 33 rotate around the axis A. When the regions of the openings 330 and the regions of the lower surfaces of the targets 29 overlap in the direction of the axis A, the targets 29 are exposed to the stage 17, that is, to the processing space S. The targets 29 of which the regions of the lower surfaces do not overlap the regions of the openings 330 in the direction of the axis A, are shielded from the stage 17. When it is described that an opening 330 and a target 29 coincide with each other, it means that all of the region of the lower surface of the target 29 is included in the region of the opening 330 in the direction of the axis A.

The PVD processing apparatus 10 has a gas supply mechanism 37 for supplying a processing gas such as Ar gas or the like to the processing space S in the chamber 23. The gas supply mechanism 37 has a gas supply source 37a, a flow rate controller 37b such as, for example, a mass flow controller (MFC), and a gas supply path 37c formed in the support shaft 34. The flow rate of the processing gas supplied from the gas supply source 37a is controlled by the flow rate controller 37b and supplied into the processing space S from the gas supply port 331 in the shield 33 via the gas supply path 37c.

The PVD processing apparatus 10 has a control device 100 including a memory and a processor. Based on a program and a recipe read from the memory in the control device 100, the processor in the control device 100 controls respective components such as, for example, the exhaust device 24, the DC power supply 26, the stage drive mechanism 27, the movement mechanism 35, the rotation mechanism 36, the gas supply mechanism 37, and the power supply 48. The processor in the control device 100 may acquire and execute, for example, a program or a recipe from another device via a communication line.

PVD Processing

Figure 5:
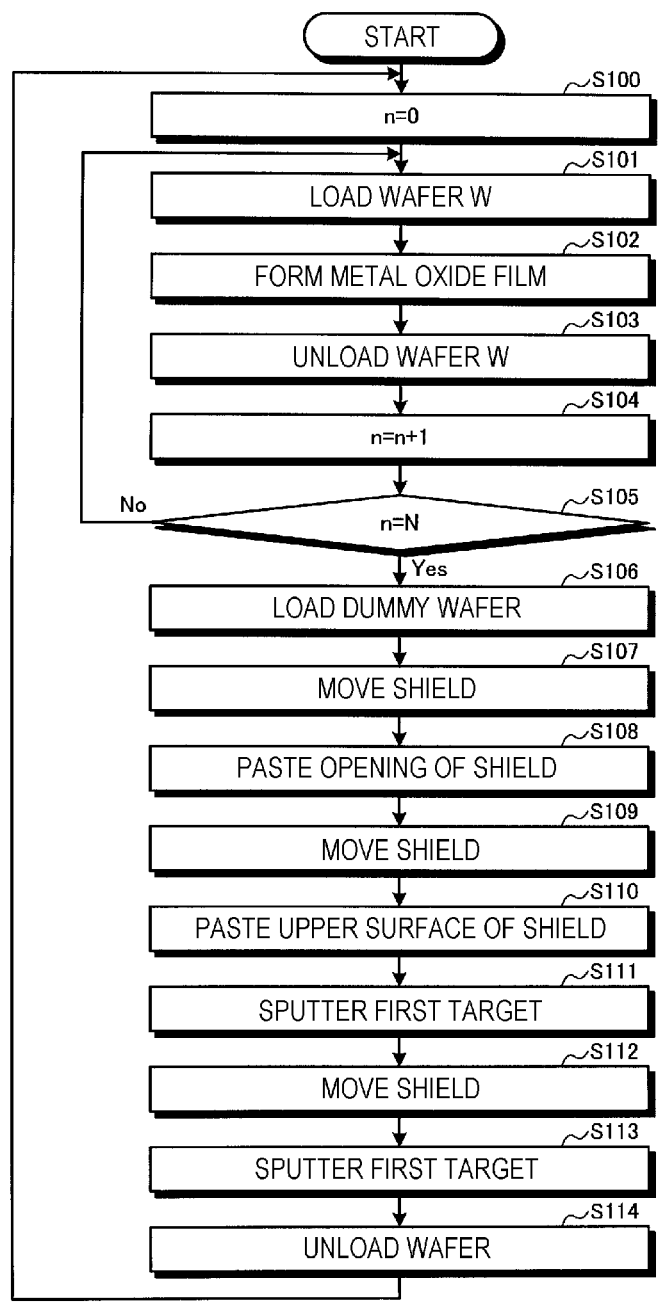
FIG. 5 is a flowchart illustrating an example of a PVD processing.

FIG. 5 is a flowchart illustrating an example of a PVD processing. Each processing illustrated in the flowchart of FIG. 5 is implemented when the processor in the control device 100 controls each component in the PVD processing apparatus 10 on the basis of the program read out from the memory in the control device 100. In addition, while each of the processes illustrated in the flowchart of FIG. 5 is being executed, the processor in the control device 100 adjusts the power supplied to the heater 332 in the shield 33 such that the shield 33 is heated to a predetermined temperature.

First, a variable n for counting the number of processed wafers W is initialized to 0 (S100). Then, the gate valve 12 is opened, and a wafer W before film formation is loaded into the chamber 23 and placed on the electrostatic chuck 17b by, for example, a robot arm (not illustrated) (S101). Then, the wafer W is attracted and held on the upper surface of the electrostatic chuck 17b by the electrostatic force generated by the DC voltage applied from the DC power supply 26 to the electrode film 17c.

Figure 6:
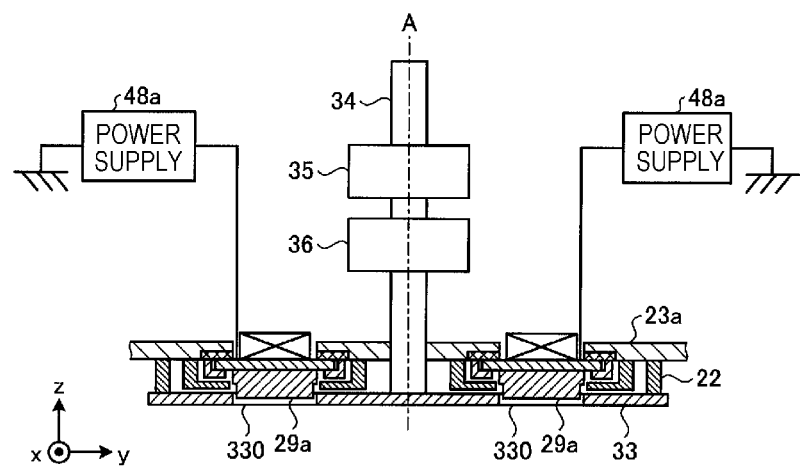
FIG. 6 is a view illustrating an example of a state of the shield.
Figure 7:
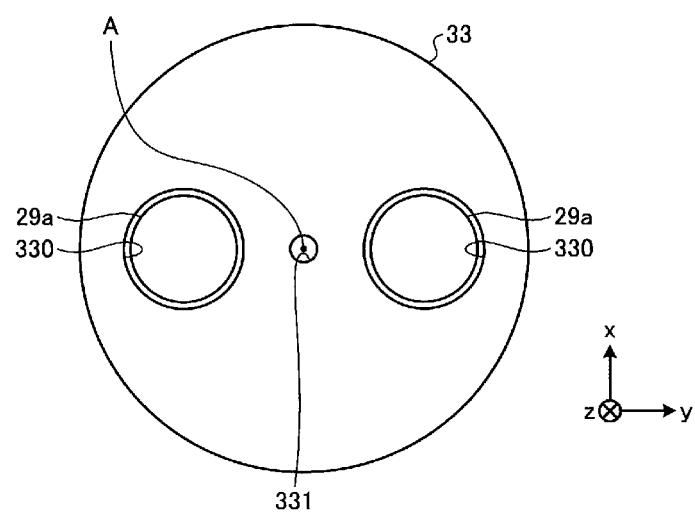
FIG. 7 is a view illustrating an example of a positional relationship between the shield and a first target.

Next, by sputtering the first targets 29a, a metal oxide film is formed on the wafer W (S102). Specifically, as illustrated in FIGS. 6 and 7, the rotation mechanism 36 rotates the shield 33 such that the regions of the lower surfaces of the first targets 29a are included in the regions of the openings 330 of the shield 33 in the direction of the axis A so as to expose the first targets 29a to the stage 17. Then, the shield 33 is moved upward by the movement mechanism 35 so as to be close to the first target 29a. Then, the shield 33 and the ground member 22 come into contact with each other, and thus the shield 33 is grounded.

Next, the processing gas is supplied into the processing space S by the gas supply mechanism 37, and an AC voltage is applied to each of the first targets 29a from the power supply 48a. As a result, the processing gas is excited in the processing space S and plasma is generated. Then, the plasma is concentrated in the vicinity of the respective first targets 29a by the magnetic fields generated in the vicinity of the respective first targets 29a by the magnets 32 provided on the rear surfaces of the first targets 29a. Since each of the first targets 29a behaves as a cathode electrode, each of the first targets 29a is sputtered by positive ions in the plasma. As a result, metal oxide particles generated by sputtering from each of the first targets 29a are scattered into the processing space S via the openings 330 in the shield 33, and are deposited on the wafer W on the stage 17. As a result, a metal oxide thin film is formed on the wafer W. Step S102 corresponds to an example of the first process and the second process.

Here, the metal oxide particles generated by sputtering from each of the first targets 29a are scattered into the processing space S through the openings 330 in the shield 33, but more metal oxide particles are deposited in the vicinity of the openings 330 in the shield 33 which are close to the first targets 29a. Therefore, when film formation of the metal oxide film is performed on a plurality of wafers W, there is a high possibility that the particles of metal oxide are generated from the vicinity of the openings 330 in the shield 33.

Next, the gate valve 12 is opened, and the wafer W after film formation is unloaded from the chamber 23 by, for example, a robot arm (not illustrated) (S103). Then, 1 is added to the variable n (S104). Then, it is determined whether or not the value of the variable n reaches the value of the predetermined number N (S105). When the value of the variable n does not reach the value of the predetermined number N (S105: No), the processing illustrated in the step S101 is executed again.

On the other hand, when the value of the variable n reaches the value of the predetermined number N (S105: Yes), a dummy wafer is loaded into the chamber 23 and placed on the electrostatic chuck 17b by, for example, a robot arm (not illustrated) (S106). Then, the wafer W is attracted and held on the upper surface of the electrostatic chuck 17b by the electrostatic force generated by the DC voltage applied from the DC power supply 26 to the electrode film 17c.

Figure 8:
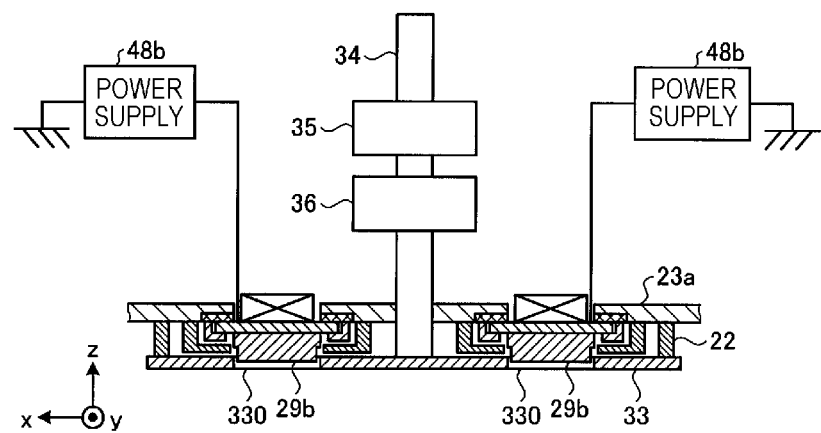
FIG. 8 is a view illustrating an example of a state of the shield.
Figure 9:
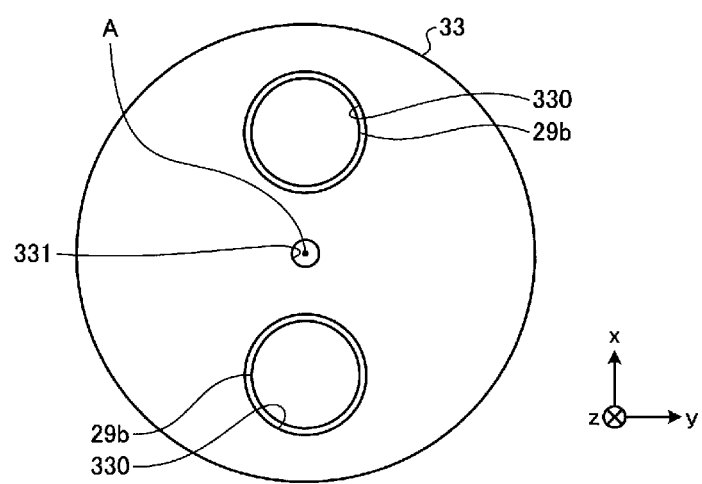
FIG. 9 is a view illustrating an example of a positional relationship between the shield and a second target.

Next, the shield 33 is moved by the movement mechanism 35 and the rotation mechanism 36 (S107). In step S107, the shield 33 is moved to a position away from the first targets 29a by the movement mechanism 35, and the shield 33 is rotated (e.g., 90 degrees) by the rotation mechanism 36 such that the regions of the lower surface of the second targets 29b are included in the regions of the openings 330 in the shield 33 in the direction of the axis A. Then, the shield 33 is moved upward by the movement mechanism 35 so as to be close to the second targets 29b. Then, the shield 33 and the ground member 22 come into contact with each other, and thus the shield 33 is grounded. As a result, the positional relationship between the openings 330 in the shield 33 and the second targets 29b are as illustrated in FIGS. 8 and 9, for example. Step S107 is an example of the third process.

Next, by sputtering the second targets 29b, the openings 330 of the shield 33 are pasted with the metal particles of the second targets 29b (S108). Step S108 is an example of the fourth process. In step S108, the processing gas is supplied into the processing space S by the gas supply mechanism 37, and a negative DC voltage is applied to each of the second targets 29b from the power supply 48b. As a result, the processing gas is excited in the processing space S and plasma is generated. Then, the plasma is concentrated in the vicinity of the respective second targets 29b by the magnetic fields generated in the vicinity of the respective second targets 29b by the magnets 32 provided on the rear surfaces of the second targets 29b. Since each of the second targets 29b behaves as a cathode electrode, each of the second targets 29b is sputtered by positive ions in the plasma. As a result, metal particles are generated from each second target 29b by sputtering.

In step S108, metal particles generated by sputtering from each of the second targets 29b not only scatter into the processing space S via the openings 330 in the shield 33, but also adhere to the vicinity of the openings 330 of the shield which are close to the second targets 29b. As a result, the metal oxide deposited in the vicinity of the openings 330 in the shield 33 is pasted.

Here, in the film formation processing of the metal oxide film in step S102, the first targets 29a are sputtered in a state where the openings 330 in the shield 33 are close to the first targets 29a. Therefore, most of the metal oxide particles scattered from the first targets 29a by sputtering are deposited in the vicinity of the openings 330. When the film formation of the metal oxide film is performed on a plurality of wafers W, there is a high possibility that the metal oxide deposited in the vicinity of the opening 330 in the shield 33 is turned into particles in the early stage and drifts in the processing space S in comparison with the metal oxide deposited on the surfaces of the members in the chamber 23.

On the other hand, in step S108, pasting is performed in the openings 330 in the shield 33 using the second targets 29b in the state where the openings 330 in the shield 33 are close to the second targets 29b. As a result, it is possible to cause a sufficient amount of metal particles to adhere to the openings 330 in the shield 33 by performing pasting once, and thus it is possible to prevent the metal oxide deposited in the vicinity of the openings 330 into the shield 33 from drifting in the processing space S as particles.

In step S108, the metal particles generated by sputtering from each of the second targets 29b are scattered into the processing space S through the openings 330 in the seal 33. As a result, the metal oxide film deposited on the surfaces of the members in the chamber 23 is also pasted by repeating the film formation processing of the metal oxide film in step S102. As a result, particles are suppressed from being generated from the metal oxide deposited on the surfaces of the members in the chamber 23.

Figure 10:
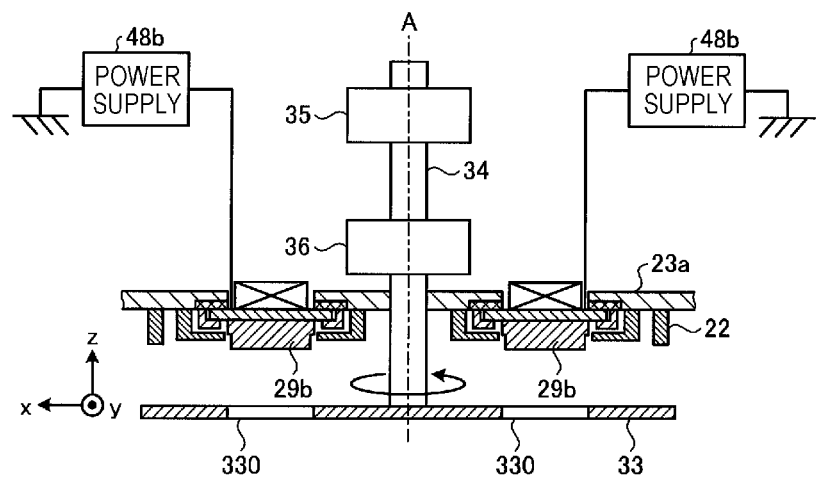
FIG. 10 is a view illustrating an example of a state of the shield.

Next, for example, as illustrated in FIG. 10, the shield 33 is moved to a position away from the second targets 29b by the movement mechanism 35 (S109). Then, for example, as illustrated in FIG. 10, by sputtering the second targets 29b while rotating the shield 33 about the axis A by the rotation mechanism 36, the upper surface (the surface on the side of the targets 29) of the shield 33 is pasted with the metal particles of the second targets 29b (S110). In step S110, the second targets 29b may be sputtered in each of the state where the second targets 29b are exposed to the processing space S through the openings 330 and the state where the second targets 29b are shielded by the shield 33. Thus, the shield 33 may not be continuously rotated by the rotation mechanism 36 while the second targets 29b are being sputtered. Step S109 is an example of the fifth process, and step S110 is an example of the sixth process.

Here, in the film formation processing of the metal oxide film in step S102, the first targets 29a are sputtered in a state where the openings 330 in the shield 33 are close to the first targets 29a. Most of the particles of metal oxide scattered from the first targets 29a by sputtering are scattered to the processing space S side via the openings 330, but some of the particles are scattered to the space between the ceiling portion 23a and the upper surface of the shield 33. When the film formation of the metal oxide film is performed on a plurality of wafers W, the metal oxide is also deposited on the upper surface side of the shield 33, which causes generation of particles.

It is also conceivable to paste the upper surface of the shield 33 by performing pasting using the second targets 29b in the state where the openings 330 in the shield 33 are close to the second targets 29b. However, most of the metal particles scattered from the second targets by sputtering are deposited on the portions of the openings 330 or scattered to the stage 17 side via the openings 330. Therefore, it is difficult to cause a sufficient amount of metal particles to be scattered to the space between the ceiling portion 23a and the upper surface of the shield 33 by performing pasting once. Therefore, in the present embodiment, each time when the film formation of a metal oxide film is performed on a predetermined number of wafers W, the shield 33 is moved to a position away from the second targets 29b and then pasting is performed on the upper surface of the shield 33 using the second targets 29b. As a result, it is possible to cause a sufficient amount of metal particles to be scattered on the upper surface side of the shield 33, and thus it is possible to suppress the generation of particles by the metal oxide.

In the present embodiment, pasting is performed on the upper surface of the shield 33 using the second targets 29b while rotating the shield 33. As a result, it is possible to cause the metal particles to be efficiently deposited on the entire upper surface of the shield 33.

Returning back to FIG. 5, the description will be continued. Next, in a state where the shield 33 is in a position away from the first targets 29a and the second targets 29b, the first targets 29a are sputtered while rotating the shield 33 about the axis A by the rotation mechanism 36 (S111). As a result, the metal oxide particles of the first targets 29a are deposited on the upper surface of the shield 33. In step S111, the first targets 29a may be sputtered in each of the state where the first targets 29a are exposed to the processing space S through the openings 330 and the state where the first targets 29a are shielded by the shield 33. Thus, the shield 33 may not be continuously rotated by the rotation mechanism 36 while the first targets 29a are being sputtered. Step S111 is an example of the seventh process.

Next, for example, as illustrated in FIGS. 6 and 7, the shield 33 is moved again to a position close to the first targets 29a by the movement mechanism 35 (S112). In step S112, the shield 33 is rotated by the rotation mechanism 36 such that the regions of the lower surfaces of the first targets 29a are included in the regions of the openings 330 of the shields 33 in the direction of the axis A, and the shield 33 is moved upward by the movement mechanism 35 so as to be close to the targets 29a. Then, the shield 33 and the ground member 22 come into contact with each other, and thus the shield 33 is grounded. Step S112 is an example of the eighth process.

Then, the first targets 29a are sputtered (S113). The metal oxide particles scattered from the first targets 29a by sputtering are deposited in the vicinity of the openings 330 and scattered to the processing space S side via the openings 330 to be deposited to the surfaces of the members within the chamber 23. Step S113 is an example of the ninth process. Then, the gate valve 12 is opened, and the dummy wafer is unloaded from the chamber 23 by, for example, a robot arm (not illustrated) (S114). Then, the processing illustrated in step S100 is executed again.

By executing steps S111 to S113, metal particles deposited on the surfaces of the first targets 29a are removed by the processings of steps S108 and S110. By executing steps S111 to S113, the states of the upper surface of the shield 33 and the surfaces of the members in the chamber 23 may be changed to the surface states when the metal oxide film is formed on a wafer W (so-called conditioning may be performed).

In the foregoing, the embodiment has been described above. According to the PVD processing apparatus 10 of the above-described embodiment, it is possible to suppress generation of particles.

Others

The present disclosure is not limited to the above-described embodiment, and various modifications are possible within the scope of the gist thereof.

Figure 11:
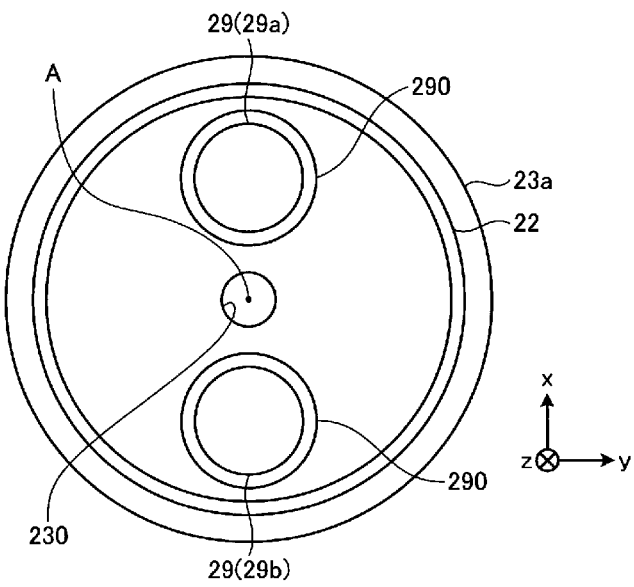
FIG. 11 is a plan view illustrating another example of the target arrangement when the ceiling portion is viewed from below.
Figure 12:
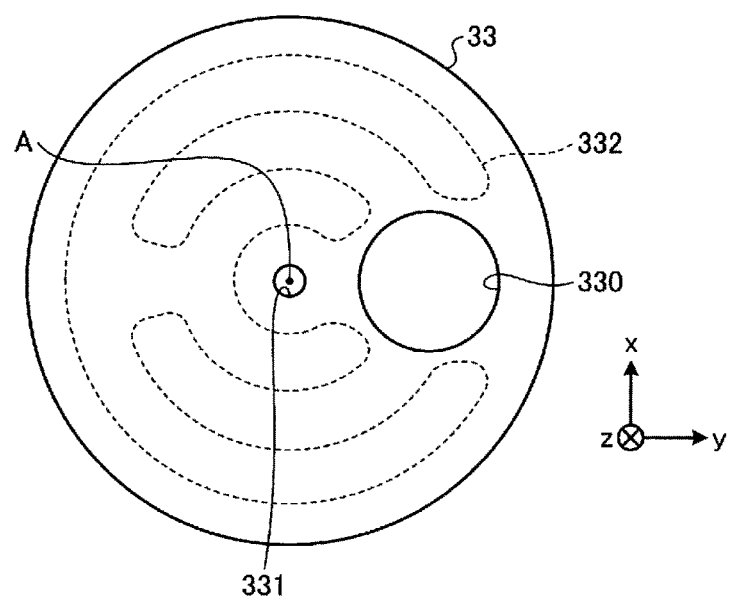
FIG. 12 is a plan view illustrating another example of the shield.

For example, in the exemplary described above, for example, as illustrated in FIG. 2, two first targets 29a and two second targets 29b are disposed on the ceiling portion 23a, but the disclosed technology is limited to this. For example, as illustrated in FIG. 11, one first target 29a and one second target 29b may be disposed on the ceiling portion 23a. In this case, for example, as illustrated in FIG. 12, a shield 33 having one opening 330 is used.

In the above-described embodiment, the pasting using the second target 29b is performed each time when the number of wafers W on which the metal oxide film is formed reaches the predetermined number N. However, the disclosed technology is limited thereto. For example, the pasting using the second targets 29b may be performed each time when the cumulative time of the film formation processing reaches a predetermined time, or the pasting using the second targets 29b may be performed every predetermined time such as every several hours or every several days, or each time when one wafer W is processed.

Further, in the above-described embodiment, after the film formation of the metal oxide film is performed on the predetermined number N of wafers W, the pasting using the second targets 29b and the conditioning using the first targets 29a are performed, but the disclosed technique is not limited thereto. For example, before the film formation of the metal oxide film is performed on the first wafer W, pasting using the second targets 29b and conditioning using the first targets 29a may be performed. As a result, before film formation of the metal oxide film is performed on the first wafer W, pasting may be performed on the particles adhering to the surfaces of the members in the chamber 23 using the metal particles of the second targets 29b, so that generation of particles can be further suppressed.

In the above-described embodiment, at least during the film formation of the metal oxide film on a wafer W, the stage 17 is rotated above the axis A, thereby rotating the wafer W about the axis A, but the disclosed technique is not limited thereto. For example, at least during the film formation of the metal oxide film on the wafer W, the stage 17 may be rotated about an axis A' (not illustrated) inclined with respect to the axis A, thereby rotating the wafer W about the axis A'.

In the above-described embodiment, the targets 29 and the wafer W on the stage 17 are disposed in the chamber 23 to face each other in the z-axis direction which is the vertical direction, but the disclosed technique is limited thereto.

Each of the targets 29 and the wafer W on the state may be disposed in the chamber 23 to face each other in a direction different from the vertical direction, for example in the horizontal direction. Even in the case where the respective targets 29 and the wafer W on the stage 17 are disposed to face each other, the wafer W may be disposed in the upper portion within the chamber 23 and the respective targets 29 may be disposed in the lower portion of the chamber 23.

In the above-described embodiment, the processing in step S110 is performed after the processing in step S108, but in other embodiments, the processing in step S110 may be performed before the processing in step S108. In addition, in the above-described embodiment, the processing in step S113 is performed after the processing in step S111, but in other embodiments, the processing in step S113 may be performed before the processing in step S111.

In the above-described embodiment, in step S110, the second targets 29b are sputtered while rotating the shield 33 by the rotation mechanism 36, but in other embodiments, the second targets 29b may be sputtered without rotating the shield 33. In the above-described embodiment, in step S111, the first targets 29a are sputtered while rotating the shield 33 by the rotation mechanism 36, but in other embodiments, the first targets 29a may be sputtered without rotating the shield 33.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A PVD processing method comprising:
providing a PVD processing apparatus including:
a holder provided with a first target containing a metal oxide as a main component and a second target containing a metal included in the metal oxide of the first target as a constituting component,
a stage that accommodates a substrate as a film forming object, and
a shield including an opening and provided between the holder and the stage;
performing a first process of aligning the opening of the shield with the holder such that the opening coincides with the first target so as to expose the first target to the stage, and bringing the opening close to the first target;
after performing the first process, performing a second process of performing sputtering using the first target;
performing a third process of aligning the opening of the shield with the holder such that the opening coincides with the second target so as to expose the second target to the stage, and bringing the opening close to the second target;
after performing the third process, performing a fourth process of performing sputtering using the second target;
performing a fifth process of moving the shield to a position located away from the first target and the second target; and
after performing the fifth process, performing a sixth process of performing sputtering using the second target after the fifth process, wherein a distance between the shield and the second target during the sixth process is longer than a distance between the shield and the first target during the second process.

2. The PVD processing method of claim 1, wherein, in the sixth process, the sputtering is performed using the second target sequentially in each of a first state where the second target is exposed to the stage via the opening and a second state where the second target is shielded by the shield.

3. The PVD processing method of claim 1, further comprising:
a seventh process of performing sputtering using the first target in a state where the shield is at a position located away from the first target and the second target after the fourth process or the sixth process.

4. The PVD processing method of claim 3, wherein, in the seventh process, the sputtering is performed using the first target sequentially in each of a first state where the first target is exposed to the stage via the opening and a second state where the first target is shielded by the shield.

5. The PVD processing method of claim 3, further comprising:
an eighth process of making the opening of the shield coincide with the first target so as to expose the first target to the stage, and bringing the opening close to the first target after the sixth process or the seventh process; and
a ninth process of performing sputtering using the first target.

6. The PVD processing method of claim 3, further comprising performing the third to seventh processes before the first process.

7. The PVD processing method of claim 1, wherein the metal oxide is magnesium oxide, and the metal constituting the metal oxide is magnesium.

8. The PVD processing method of claim 1, wherein before the second process, the substrate is placed on the stage, and
after the second process and before the fourth process, the substrate is unloaded from the stage and then a dummy substrate is placed on the stage.

* * * * *